United States Patent
Cowan et al.

(10) Patent No.: US 7,616,017 B2
(45) Date of Patent: Nov. 10, 2009

(54) PROBE STATION THERMAL CHUCK WITH SHIELDING FOR CAPACITIVE CURRENT

(75) Inventors: Clarence E. Cowan, Newberg, OR (US); Paul A. Tervo, Vancouver, WA (US); John L. Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 15 days.

(21) Appl. No.: 11/975,221

(22) Filed: Oct. 17, 2007

(65) Prior Publication Data

US 2008/0042680 A1  Feb. 21, 2008

Related U.S. Application Data

(63) Continuation of application No. 11/546,827, filed on Oct. 11, 2006, now Pat. No. 7,292,057, which is a continuation of application No. 10/626,903, filed on Jul. 25, 2003, now Pat. No. 7,138,813, which is a continuation of application No. 10/308,847, filed on Dec. 2, 2002, now Pat. No. 6,642,732, which is a continuation of application No. 10/179,771, filed on Jun. 24, 2002, now Pat. No. 6,512,391, which is a continuation of application No. 09/345,571, filed on Jun. 30, 1999, now Pat. No. 6,445,202.

(51) Int. Cl.
*G01R 31/02* (2006.01)
*G01R 31/26* (2006.01)

(52) U.S. Cl. .................. 324/760; 324/158.1; 324/765; 219/410; 219/521

(58) Field of Classification Search .................. 324/760; 219/410, 521
See application file for complete search history.

(56) References Cited

U.S. PATENT DOCUMENTS

| 1,191,486 | A | 7/1916 | Tyler |
| 1,337,866 | A | 4/1920 | Whitacker |
| 2,106,003 | A | 1/1938 | Hewitt |
| 2,142,625 | A | 1/1939 | Zoethout |

(Continued)

FOREIGN PATENT DOCUMENTS

CN  1083975  3/1994

(Continued)

OTHER PUBLICATIONS

Mark S. Boguski and Martin W. McIntosh, "Biomedical informatics for proteomics," insight: review article, Nature 422, 233-237 (2003); doi:10.1038/nature01515.

(Continued)

*Primary Examiner*—Ha Tran T Nguyen
*Assistant Examiner*—Emily Y Chan
(74) *Attorney, Agent, or Firm*—Chernoff, Vilhauer, McClung & Stenzel, LLP

(57) ABSTRACT

To reduce the time to make measurements and the noise in measurements obtained by probing a device supported on surface of a thermal chuck in a probe station, a conductive member is arranged to intercept current coupling the thermal unit of the chuck to the surface supporting the device. The conductive member is capacitively coupled to the thermal unit but free of direct electrical connection thereto.

19 Claims, 5 Drawing Sheets

U.S. PATENT DOCUMENTS

| | | |
|---|---|---|
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischettl |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A * | 9/1974 | Anderson .................. 219/411 |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A * | 8/1987 | Gore .......................... 219/210 |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,709,141 A | 11/1987 | Olsen et al. |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |

| | | | | | |
|---|---|---|---|---|---|
| 4,739,259 A | 4/1988 | Hadwin et al. | 5,030,907 A | 7/1991 | Yih et al. |
| 4,742,571 A | 5/1988 | Letron | 5,034,688 A | 7/1991 | Moulene et al. |
| 4,744,041 A | 5/1988 | Strunk et al. | 5,041,782 A | 8/1991 | Marzan |
| 4,746,857 A | 5/1988 | Sakai et al. | 5,045,781 A | 9/1991 | Gleason et al. |
| 4,754,239 A | 6/1988 | Sedivec | 5,061,823 A | 10/1991 | Carroll |
| 4,755,746 A | 7/1988 | Mallory et al. | 5,065,089 A | 11/1991 | Rich |
| 4,755,747 A | 7/1988 | Sato | 5,065,092 A | 11/1991 | Sigler |
| 4,755,874 A | 7/1988 | Esrig et al. | 5,066,357 A | 11/1991 | Smyth, Jr. et al. |
| 4,757,255 A | 7/1988 | Margozzi | 5,070,297 A | 12/1991 | Kwon et al. |
| 4,758,785 A | 7/1988 | Rath | 5,077,523 A | 12/1991 | Blanz |
| 4,759,712 A | 7/1988 | Demand | 5,082,627 A | 1/1992 | Stanbro |
| 4,766,384 A | 8/1988 | Kleinberg et al. | 5,084,671 A | 1/1992 | Miyata et al. |
| 4,771,234 A | 9/1988 | Cook et al. | 5,089,774 A | 2/1992 | Nakano |
| 4,772,846 A | 9/1988 | Reeds | 5,091,691 A | 2/1992 | Kamieniecki et al. |
| 4,777,434 A | 10/1988 | Miller et al. | 5,091,692 A | 2/1992 | Ohno et al. |
| 4,780,670 A | 10/1988 | Cherry | 5,091,732 A | 2/1992 | Mileski et al. |
| 4,783,625 A | 11/1988 | Harry et al. | 5,094,536 A | 3/1992 | MacDonald et al. |
| 4,784,213 A | 11/1988 | Eager et al. | 5,095,891 A | 3/1992 | Reitter |
| 4,786,867 A | 11/1988 | Yamatsu | 5,097,207 A | 3/1992 | Blanz |
| 4,787,752 A | 11/1988 | Fraser et al. | 5,101,149 A | 3/1992 | Adams et al. |
| 4,791,363 A | 12/1988 | Logan | 5,101,453 A | 3/1992 | Rumbaugh |
| 4,795,962 A | 1/1989 | Yanagawa et al. | 5,103,169 A | 4/1992 | Heaton et al. |
| 4,805,627 A | 2/1989 | Klingenbeck et al. | 5,105,148 A | 4/1992 | Lee |
| 4,810,981 A | 3/1989 | Herstein | 5,105,181 A | 4/1992 | Ross |
| 4,812,754 A | 3/1989 | Tracy et al. | 5,107,076 A | 4/1992 | Bullock et al. |
| 4,816,767 A | 3/1989 | Cannon et al. | 5,136,237 A | 8/1992 | Smith et al. |
| 4,818,169 A | 4/1989 | Schram et al. | 5,142,224 A | 8/1992 | Smith et al. |
| 4,827,211 A | 5/1989 | Strid et al. | 5,144,228 A | 9/1992 | Sorna et al. |
| 4,831,494 A | 5/1989 | Arnold et al. | 5,159,264 A | 10/1992 | Anderson |
| 4,838,802 A | 6/1989 | Soar | 5,159,267 A | 10/1992 | Anderson |
| 4,839,587 A | 6/1989 | Flatley et al. | 5,159,752 A | 11/1992 | Mahant-Shetti et al. |
| 4,845,426 A | 7/1989 | Nolan et al. | 5,160,883 A | 11/1992 | Blanz |
| 4,849,689 A | 7/1989 | Gleason et al. | 5,164,319 A | 11/1992 | Hafeman et al. |
| 4,853,613 A | 8/1989 | Sequeira et al. | 5,164,661 A | 11/1992 | Jones |
| 4,853,624 A | 8/1989 | Rabjohn | 5,166,606 A | 11/1992 | Blanz |
| 4,853,627 A | 8/1989 | Gleason et al. | 5,172,049 A | 12/1992 | Kiyokawa et al. |
| 4,856,426 A | 8/1989 | Wirz | 5,172,051 A | 12/1992 | Zamborelli |
| 4,856,904 A | 8/1989 | Akagawa | 5,187,443 A | 2/1993 | Bereskin |
| 4,858,160 A | 8/1989 | Strid et al. | 5,198,752 A | 3/1993 | Miyata et al. |
| 4,859,989 A | 8/1989 | McPherson | 5,198,753 A | 3/1993 | Hamburgen |
| 4,864,227 A | 9/1989 | Sato | 5,198,756 A | 3/1993 | Jenkins et al. |
| 4,871,883 A | 10/1989 | Guiol | 5,198,758 A | 3/1993 | Iknaian et al. |
| 4,871,965 A | 10/1989 | Elbert et al. | 5,202,558 A | 4/1993 | Barker |
| 4,884,026 A | 11/1989 | Hayakawa et al. | 5,209,088 A | 5/1993 | Vaks |
| 4,884,206 A | 11/1989 | Mate | 5,210,377 A | 5/1993 | Kennedy et al. |
| 4,888,550 A | 12/1989 | Reid | 5,210,485 A | 5/1993 | Kreiger et al. |
| 4,891,584 A | 1/1990 | Kamieniecki et al. | 5,214,243 A | 5/1993 | Johnson |
| 4,893,914 A | 1/1990 | Hancock et al. | 5,214,374 A | 5/1993 | St. Onge |
| 4,894,612 A | 1/1990 | Drake et al. | 5,218,185 A | 6/1993 | Gross |
| 4,896,109 A | 1/1990 | Rauscher | 5,220,277 A | 6/1993 | Reitinger |
| 4,899,998 A | 2/1990 | Teramachi | 5,221,905 A | 6/1993 | Bhangu et al. |
| 4,904,933 A | 2/1990 | Snyder et al. | 5,225,037 A | 7/1993 | Elder et al. |
| 4,904,935 A | 2/1990 | Calma et al. | 5,225,796 A | 7/1993 | Williams et al. |
| 4,906,920 A | 3/1990 | Huff et al. | 5,227,730 A | 7/1993 | King et al. |
| 4,916,398 A | 4/1990 | Rath | 5,232,789 A | 8/1993 | Platz et al. |
| 4,918,279 A | 4/1990 | Babel et al. | 5,233,197 A | 8/1993 | Bowman et al. |
| 4,918,374 A | 4/1990 | Stewart et al. | 5,233,291 A | 8/1993 | Kouno et al. |
| 4,918,383 A | 4/1990 | Huff et al. | 5,233,306 A | 8/1993 | Misra |
| 4,922,128 A | 5/1990 | Dhong et al. | 5,237,267 A | 8/1993 | Harwood et al. |
| 4,922,186 A | 5/1990 | Tsuchiya et al. | 5,245,292 A | 9/1993 | Milesky et al. |
| 4,923,407 A | 5/1990 | Rice et al. | 5,266,889 A | 11/1993 | Harwood et al. |
| 4,926,118 A | 5/1990 | O'Connor et al. | 5,267,088 A | 11/1993 | Nomura |
| 4,929,893 A | 5/1990 | Sato et al. | 5,270,664 A | 12/1993 | McMurtry et al. |
| 4,933,634 A | 6/1990 | Cuzin et al. | 5,274,336 A | 12/1993 | Crook et al. |
| 4,968,931 A | 11/1990 | Littlebury et al. | 5,278,494 A | 1/1994 | Obigane |
| 4,978,907 A | 12/1990 | Smith | 5,280,156 A | 1/1994 | Niori et al. |
| 4,978,914 A | 12/1990 | Akimoto et al. | 5,298,972 A | 3/1994 | Heffner |
| 4,982,153 A | 1/1991 | Collins et al. | 5,303,938 A | 4/1994 | Miller et al. |
| 4,994,737 A | 2/1991 | Carlton et al. | 5,304,924 A | 4/1994 | Yamano et al. |
| 5,001,423 A | 3/1991 | Abrami et al. | 5,315,237 A | 5/1994 | Iwakura et al. |
| 5,006,796 A | 4/1991 | Burton et al. | 5,321,352 A | 6/1994 | Takebuchi |
| 5,010,296 A | 4/1991 | Okada et al. | 5,321,453 A | 6/1994 | Mori et al. |
| 5,019,692 A | 5/1991 | Nbedi et al. | 5,325,052 A | 6/1994 | Yamashita |

| | | | | | | |
|---|---|---|---|---|---|---|
| 5,334,931 A | 8/1994 | Clarke et al. | | 5,594,358 A | 1/1997 | Ishikawa et al. |
| 5,336,989 A | 8/1994 | Hofer | | 5,600,256 A | 2/1997 | Woith et al. |
| 5,345,170 A | 9/1994 | Schwindt et al. | | 5,604,444 A | 2/1997 | Harwood et al. |
| 5,357,211 A | 10/1994 | Bryson et al. | | 5,610,529 A | 3/1997 | Schwindt |
| 5,363,050 A | 11/1994 | Guo et al. | | 5,611,946 A | 3/1997 | Leong et al. |
| 5,369,368 A | 11/1994 | Kassen et al. | | 5,617,035 A | 4/1997 | Swapp |
| 5,369,370 A | 11/1994 | Stratmann et al. | | 5,628,057 A | 5/1997 | Phillips et al. |
| 5,371,457 A | 12/1994 | Lipp | | 5,629,631 A | 5/1997 | Perry et al. |
| 5,373,231 A | 12/1994 | Boll et al. | | 5,631,571 A | 5/1997 | Spaziani et al. |
| 5,374,938 A | 12/1994 | Hatazawa et al. | | 5,633,780 A | 5/1997 | Cronin |
| 5,376,790 A | 12/1994 | Linker et al. | | 5,640,101 A | 6/1997 | Kuji et al. |
| 5,382,898 A | 1/1995 | Subramanian | | 5,642,298 A | 6/1997 | Mallory et al. |
| 5,397,855 A | 3/1995 | Ferlier | | 5,644,248 A | 7/1997 | Fujimoto |
| 5,404,111 A | 4/1995 | Mori et al. | | 5,646,538 A | 7/1997 | Lide et al. |
| 5,408,188 A | 4/1995 | Katoh | | 5,653,939 A | 8/1997 | Hollis et al. |
| 5,408,189 A | 4/1995 | Swart et al. | | 5,656,942 A | 8/1997 | Watts et al. |
| 5,410,259 A | 4/1995 | Fujihara et al. | | 5,657,394 A | 8/1997 | Schwartz et al. |
| 5,412,330 A | 5/1995 | Ravel et al. | | 5,659,255 A | 8/1997 | Strid et al. |
| 5,412,866 A | 5/1995 | Woith et al. | | 5,659,421 A | 8/1997 | Rahmel et al. |
| 5,414,565 A | 5/1995 | Sullivan et al. | | 5,663,653 A | 9/1997 | Schwindt et al. |
| 5,422,574 A | 6/1995 | Kister | | 5,666,063 A | 9/1997 | Abercrombie et al. |
| 5,434,512 A | 7/1995 | Schwindt et al. | | 5,668,470 A | 9/1997 | Shelor |
| 5,448,172 A | 9/1995 | Dechene et al. | | 5,669,316 A | 9/1997 | Faz et al. |
| 5,451,884 A | 9/1995 | Sauerland | | 5,670,322 A | 9/1997 | Eggers et al. |
| 5,457,398 A | 10/1995 | Schwindt et al. | | 5,670,888 A | 9/1997 | Cheng |
| 5,461,328 A | 10/1995 | Devereaux et al. | | 5,672,816 A | 9/1997 | Park et al. |
| 5,467,024 A | 11/1995 | Swapp | | 5,675,499 A | 10/1997 | Lee et al. |
| 5,469,324 A | 11/1995 | Henderson et al. | | 5,675,932 A | 10/1997 | Mauney |
| 5,475,316 A | 12/1995 | Hurley et al. | | 5,676,360 A | 10/1997 | Boucher et al. |
| 5,477,011 A | 12/1995 | Singles et al. | | 5,680,039 A | 10/1997 | Mochizuki et al. |
| 5,478,748 A | 12/1995 | Akins, Jr. et al. | | 5,682,337 A | 10/1997 | El-Fishawy et al. |
| 5,479,108 A | 12/1995 | Cheng | | 5,685,232 A | 11/1997 | Inoue |
| 5,479,109 A | 12/1995 | Lau et al. | | 5,704,355 A | 1/1998 | Bridges |
| 5,481,196 A | 1/1996 | Nosov | | 5,712,571 A | 1/1998 | O'Donoghue |
| 5,481,936 A | 1/1996 | Yanagisawa | | 5,715,819 A | 2/1998 | Svenson et al. |
| 5,486,975 A | 1/1996 | Shamouilian et al. | | 5,729,150 A | 3/1998 | Schwindt |
| 5,488,954 A | 2/1996 | Sleva et al. | | 5,731,708 A | 3/1998 | Sobhani |
| 5,491,426 A | 2/1996 | Small | | 5,731,920 A | 3/1998 | Katsuragawa |
| 5,493,070 A | 2/1996 | Habu | | 5,744,971 A | 4/1998 | Chan et al. |
| 5,493,236 A | 2/1996 | Ishii et al. | | 5,748,506 A | 5/1998 | Bockelman |
| 5,500,606 A | 3/1996 | Holmes | | 5,751,252 A | 5/1998 | Phillips |
| 5,505,150 A | 4/1996 | James et al. | | 5,767,690 A | 6/1998 | Fujimoto |
| 5,506,498 A | 4/1996 | Anderson et al. | | 5,773,951 A | 6/1998 | Markowski et al. |
| 5,506,515 A | 4/1996 | Godshalk et al. | | 5,777,485 A | 7/1998 | Tanaka et al. |
| 5,508,631 A | 4/1996 | Manku et al. | | 5,792,668 A | 8/1998 | Fuller et al. |
| 5,510,792 A | 4/1996 | Ono et al. | | 5,793,213 A | 8/1998 | Bockelman et al. |
| 5,511,010 A | 4/1996 | Burns | | 5,794,133 A | 8/1998 | Kashima |
| 5,512,835 A | 4/1996 | Rivera et al. | | 5,798,652 A | 8/1998 | Taraci |
| 5,515,167 A | 5/1996 | Ledger et al. | | 5,802,856 A | 9/1998 | Schaper et al. |
| 5,517,111 A | 5/1996 | Shelor | | 5,804,982 A | 9/1998 | Lo et al. |
| 5,521,522 A | 5/1996 | Abe et al. | | 5,804,983 A | 9/1998 | Nakajima et al. |
| 5,523,694 A | 6/1996 | Cole, Jr. | | 5,807,107 A | 9/1998 | Bright et al. |
| 5,528,158 A | 6/1996 | Sinsheimer et al. | | 5,811,751 A | 9/1998 | Leong et al. |
| 5,530,371 A | 6/1996 | Perry et al. | | 5,824,494 A | 10/1998 | Feldberg |
| 5,530,372 A | 6/1996 | Lee et al. | | 5,828,225 A | 10/1998 | Obikane et al. |
| 5,532,609 A | 7/1996 | Harwood et al. | | 5,829,437 A | 11/1998 | Bridges |
| 5,539,323 A | 7/1996 | Davis, Jr. | | 5,831,442 A | 11/1998 | Heigl |
| 5,539,676 A | 7/1996 | Yamaguchi | | 5,833,601 A | 11/1998 | Swartz et al. |
| 5,546,012 A | 8/1996 | Perry et al. | | 5,835,997 A | 11/1998 | Yassine et al. |
| 5,550,480 A | 8/1996 | Nelson et al. | | 5,838,161 A | 11/1998 | Akram et al. |
| 5,550,482 A | 8/1996 | Sano | | 5,841,288 A | 11/1998 | Meaney et al. |
| 5,552,716 A | 9/1996 | Takahashi et al. | | 5,846,708 A | 12/1998 | Hollis et al. |
| 5,554,236 A | 9/1996 | Singles et al. | | 5,847,569 A | 12/1998 | Ho et al. |
| 5,561,377 A | 10/1996 | Strid et al. | | 5,848,500 A | 12/1998 | Kirk |
| 5,561,585 A | 10/1996 | Barnes et al. | | 5,852,232 A | 12/1998 | Samsavar et al. |
| 5,565,788 A | 10/1996 | Burr et al. | | 5,854,608 A | 12/1998 | Leisten |
| 5,565,881 A | 10/1996 | Phillips et al. | | 5,857,667 A | 1/1999 | Lee |
| 5,569,591 A | 10/1996 | Kell et al. | | 5,861,743 A | 1/1999 | Pye et al. |
| 5,571,324 A | 11/1996 | Sago et al. | | 5,867,073 A | 2/1999 | Weinreb et al. |
| 5,572,398 A | 11/1996 | Federlin et al. | | 5,869,326 A | 2/1999 | Hofmann |
| 5,578,932 A | 11/1996 | Adamian | | 5,869,975 A | 2/1999 | Strid et al. |
| 5,583,445 A | 12/1996 | Mullen | | 5,874,361 A | 2/1999 | Collins et al. |
| 5,584,608 A | 12/1996 | Gillespie | | 5,879,289 A | 3/1999 | Yarush et al. |

| | | | | | | |
|---|---|---|---|---|---|---|
| 5,883,522 A | 3/1999 | O'Boyle | | 6,127,831 A | 10/2000 | Khoury et al. |
| 5,883,523 A | 3/1999 | Ferland et al. | | 6,130,544 A | 10/2000 | Strid et al. |
| 5,888,075 A | 3/1999 | Hasegawa et al. | | 6,137,302 A | 10/2000 | Schwindt |
| 5,892,539 A | 4/1999 | Colvin | | 6,137,303 A | 10/2000 | Deckert et al. |
| 5,900,737 A | 5/1999 | Graham et al. | | 6,144,212 A | 11/2000 | Mizuta |
| 5,903,143 A | 5/1999 | Mochizuki et al. | | 6,147,502 A | 11/2000 | Fryer et al. |
| 5,905,421 A | 5/1999 | Oldfield | | 6,147,851 A | 11/2000 | Anderson |
| 5,910,727 A | 6/1999 | Fujihara et al. | | 6,160,407 A | 12/2000 | Nikawa |
| 5,916,689 A | 6/1999 | Collins et al. | | 6,161,294 A | 12/2000 | Bland et al. |
| 5,923,177 A | 7/1999 | Wardwell | | 6,166,553 A | 12/2000 | Sinsheimer |
| 5,926,028 A | 7/1999 | Mochizuki | | 6,169,410 B1 | 1/2001 | Grace et al. |
| 5,942,907 A | 8/1999 | Chiang | | 6,172,337 B1 | 1/2001 | Johnsgard et al. |
| 5,944,093 A | 8/1999 | Viswanath | | 6,175,228 B1 | 1/2001 | Zamborelli et al. |
| 5,945,836 A | 8/1999 | Sayre et al. | | 6,181,144 B1 | 1/2001 | Hembree et al. |
| 5,949,383 A | 9/1999 | Hayes et al. | | 6,181,149 B1 | 1/2001 | Godfrey et al. |
| 5,949,579 A | 9/1999 | Baker | | 6,181,297 B1 | 1/2001 | Leisten |
| 5,952,842 A | 9/1999 | Fujimoto | | 6,181,416 B1 | 1/2001 | Falk |
| 5,959,461 A | 9/1999 | Brown et al. | | 6,184,845 B1 | 2/2001 | Leisten et al. |
| 5,960,411 A | 9/1999 | Hartman et al. | | 6,191,596 B1 | 2/2001 | Abiko |
| 5,963,027 A | 10/1999 | Peters | | 6,194,720 B1 | 2/2001 | Li et al. |
| 5,963,364 A | 10/1999 | Leong et al. | | 6,194,907 B1 | 2/2001 | Kanao et al. |
| 5,970,429 A | 10/1999 | Martin | | 6,198,299 B1 | 3/2001 | Hollman |
| 5,973,505 A | 10/1999 | Strid et al. | | 6,211,663 B1 | 4/2001 | Moulthrop et al. |
| 5,974,662 A | 11/1999 | Eldridge et al. | | 6,211,837 B1 | 4/2001 | Crouch et al. |
| 5,981,268 A | 11/1999 | Kovacs et al. | | 6,215,295 B1 | 4/2001 | Smith, III |
| 5,982,166 A | 11/1999 | Mautz | | 6,222,031 B1 | 4/2001 | Wakabayashi et al. |
| 5,993,611 A | 11/1999 | Moroney, III et al. | | 6,222,970 B1 | 4/2001 | Wach et al. |
| 5,995,914 A | 11/1999 | Cabot | | 6,229,322 B1 | 5/2001 | Hembree |
| 5,996,102 A | 11/1999 | Haulin | | 6,229,327 B1 | 5/2001 | Boll et al. |
| 5,998,768 A | 12/1999 | Hunter et al. | | 6,232,787 B1 | 5/2001 | Lo et al. |
| 5,999,268 A | 12/1999 | Yonezawa et al. | | 6,232,788 B1 | 5/2001 | Schwindt et al. |
| 6,001,760 A | 12/1999 | Katsuda et al. | | 6,232,789 B1 | 5/2001 | Schwindt |
| 6,002,236 A | 12/1999 | Trant et al. | | 6,232,790 B1 | 5/2001 | Bryan et al. |
| 6,002,263 A | 12/1999 | Peters et al. | | 6,233,613 B1 | 5/2001 | Walker et al. |
| 6,002,426 A | 12/1999 | Back et al. | | 6,236,223 B1 | 5/2001 | Brady et al. |
| 6,013,586 A | 1/2000 | McGhee et al. | | 6,236,975 B1 | 5/2001 | Boe et al. |
| 6,019,612 A | 2/2000 | Hasegawa et al. | | 6,236,977 B1 | 5/2001 | Verba et al. |
| 6,023,209 A | 2/2000 | Faulkner et al. | | 6,242,929 B1 | 6/2001 | Mizuta |
| 6,028,435 A | 2/2000 | Nikawa | | 6,245,692 B1 | 6/2001 | Pearce et al. |
| 6,029,141 A | 2/2000 | Bezos et al. | | 6,251,595 B1 | 6/2001 | Gordon et al. |
| 6,031,383 A | 2/2000 | Streib et al. | | 6,252,392 B1 | 6/2001 | Peters |
| 6,032,714 A | 3/2000 | Fenton | | 6,257,319 B1 | 7/2001 | Kainuma et al. |
| 6,034,533 A | 3/2000 | Tervo et al. | | 6,257,564 B1 | 7/2001 | Avneri et al. |
| 6,037,785 A | 3/2000 | Higgins | | 6,259,261 B1 | 7/2001 | Engelking et al. |
| 6,037,793 A | 3/2000 | Miyazawa et al. | | 6,265,950 B1 | 7/2001 | Schmidt et al. |
| 6,043,667 A | 3/2000 | Cadwallader et al. | | 6,271,673 B1 | 8/2001 | Furuta et al. |
| 6,043,668 A | 3/2000 | Carney | | 6,275,738 B1 | 8/2001 | Kasevich et al. |
| 6,049,216 A | 4/2000 | Yang et al. | | 6,278,051 B1 | 8/2001 | Peabody |
| 6,051,422 A | 4/2000 | Kovacs et al. | | 6,278,411 B1 | 8/2001 | Ohlsson et al. |
| 6,052,653 A | 4/2000 | Mazur et al. | | 6,281,691 B1 | 8/2001 | Matsunaga et al. |
| 6,054,869 A | 4/2000 | Hutton et al. | | 6,284,971 B1 | 9/2001 | Atalar et al. |
| 6,060,888 A | 5/2000 | Blackham et al. | | 6,288,557 B1 | 9/2001 | Peters et al. |
| 6,060,891 A | 5/2000 | Hembree et al. | | 6,292,760 B1 | 9/2001 | Burns |
| 6,060,892 A | 5/2000 | Yamagata | | 6,300,775 B1 | 10/2001 | Peach et al. |
| 6,061,589 A | 5/2000 | Bridges et al. | | 6,307,672 B1 | 10/2001 | DeNure |
| 6,064,213 A | 5/2000 | Khandros et al. | | 6,310,483 B1 | 10/2001 | Taura et al. |
| 6,064,217 A | 5/2000 | Smith | | 6,310,755 B1 | 10/2001 | Kholodenko et al. |
| 6,064,218 A | 5/2000 | Godfrey et al. | | 6,313,567 B1 | 11/2001 | Maltabes et al. |
| 6,066,911 A | 5/2000 | Lindemann et al. | | 6,313,649 B2 | 11/2001 | Harwood et al. |
| 6,078,183 A | 6/2000 | Cole, Jr. | | 6,320,372 B1 | 11/2001 | Keller |
| 6,091,236 A | 7/2000 | Piety et al. | | 6,320,396 B1 | 11/2001 | Nikawa |
| 6,091,255 A | 7/2000 | Godfrey | | 6,327,034 B1 | 12/2001 | Hoover et al. |
| 6,096,567 A | 8/2000 | Kaplan et al. | | 6,335,625 B1 | 1/2002 | Bryant et al. |
| 6,100,815 A | 8/2000 | Pailthorp | | 6,335,628 B2 | 1/2002 | Schwindt et al. |
| 6,104,203 A | 8/2000 | Costello et al. | | 6,340,568 B2 | 1/2002 | Hefti |
| 6,104,206 A | 8/2000 | Verkuil | | 6,340,895 B1 | 1/2002 | Uher et al. |
| 6,111,419 A | 8/2000 | Lefever et al. | | 6,359,456 B1 | 3/2002 | Hembree et al. |
| 6,114,865 A | 9/2000 | Lagowski et al. | | 6,362,636 B1 | 3/2002 | Peters et al. |
| 6,118,287 A | 9/2000 | Boll et al. | | 6,362,792 B1 | 3/2002 | Sawamura et al. |
| 6,118,894 A | 9/2000 | Schwartz et al. | | 6,366,247 B1 | 4/2002 | Sawamura et al. |
| 6,121,783 A | 9/2000 | Horner et al. | | 6,369,776 B1 | 4/2002 | Leisten et al. |
| 6,124,723 A | 9/2000 | Costello | | 6,376,258 B2 | 4/2002 | Hefti |
| 6,124,725 A | 9/2000 | Sato | | 6,380,751 B2 | 4/2002 | Harwood et al. |

| | | |
|---|---|---|
| 6,384,614 B1 | 5/2002 | Hager et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,560 B1 | 6/2002 | Walraven et al. |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,141 B1 | 7/2002 | Hollman et al. |
| 6,424,316 B1 | 7/2002 | Leisten |
| 6,445,202 B1 | 9/2002 | Cowan et al. |
| 6,447,339 B1 | 9/2002 | Reed et al. |
| 6,448,788 B1 | 9/2002 | Meaney et al. |
| 6,459,739 B1 | 10/2002 | Vitenberg |
| 6,466,046 B1 | 10/2002 | Maruyama et al. |
| 6,468,816 B2 | 10/2002 | Hunter |
| 6,476,442 B1 | 11/2002 | Williams et al. |
| 6,480,013 B1 | 11/2002 | Nayler et al. |
| 6,481,939 B1 | 11/2002 | Gillespie et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,490,471 B2 | 12/2002 | Svenson et al. |
| 6,492,822 B2 | 12/2002 | Schwindt et al. |
| 6,501,289 B1 | 12/2002 | Takekoshi |
| 6,512,391 B2 * | 1/2003 | Cowan et al. ............... 324/760 |
| 6,512,482 B1 | 1/2003 | Nelson et al. |
| 6,515,494 B1 | 2/2003 | Low |
| 6,528,993 B1 | 3/2003 | Shin et al. |
| 6,529,844 B1 | 3/2003 | Kapetanic et al. |
| 6,548,311 B1 | 4/2003 | Knoll |
| 6,549,022 B1 | 4/2003 | Cole, Jr. et al. |
| 6,549,026 B1 | 4/2003 | Dibattista et al. |
| 6,549,106 B2 | 4/2003 | Martin |
| 6,566,079 B2 | 5/2003 | Hefti |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,603,322 B1 | 8/2003 | Boll et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,611,417 B2 | 8/2003 | Chen |
| 6,617,862 B1 | 9/2003 | Bruce |
| 6,621,082 B2 | 9/2003 | Morita et al. |
| 6,624,891 B2 | 9/2003 | Marcus et al. |
| 6,627,461 B2 | 9/2003 | Chapman et al. |
| 6,628,503 B2 | 9/2003 | Sogard |
| 6,628,980 B2 | 9/2003 | Atalar et al. |
| 6,633,174 B1 | 10/2003 | Satya et al. |
| 6,636,059 B2 | 10/2003 | Harwood et al. |
| 6,636,182 B2 | 10/2003 | Mehltretter |
| 6,639,415 B2 | 10/2003 | Peters et al. |
| 6,639,461 B1 | 10/2003 | Tam et al. |
| 6,642,732 B2 | 11/2003 | Cowan et al. |
| 6,643,597 B1 | 11/2003 | Dunsmore |
| 6,650,135 B1 | 11/2003 | Mautz et al. |
| 6,653,903 B2 | 11/2003 | Leich et al. |
| 6,657,214 B1 | 12/2003 | Foegelle et al. |
| 6,657,601 B2 | 12/2003 | McLean |
| 6,686,753 B1 | 2/2004 | Kitahata |
| 6,701,265 B2 | 3/2004 | Hill et al. |
| 6,707,548 B2 | 3/2004 | Kreimer et al. |
| 6,710,798 B1 | 3/2004 | Hershel et al. |
| 6,717,426 B2 | 4/2004 | Iwasaki |
| 6,720,782 B2 | 4/2004 | Schwindt et al. |
| 6,724,205 B1 | 4/2004 | Hayden et al. |
| 6,724,928 B1 | 4/2004 | Davis |
| 6,727,716 B1 | 4/2004 | Sharif |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,739,208 B2 | 5/2004 | Hyakudomi |
| 6,744,268 B2 | 6/2004 | Hollman |
| 6,753,679 B1 | 6/2004 | Kwong et al. |
| 6,753,699 B2 | 6/2004 | Stockstad |
| 6,756,751 B2 | 6/2004 | Hunter |
| 6,768,328 B2 | 7/2004 | Self et al. |
| 6,770,955 B1 | 8/2004 | Coccioli et al. |
| 6,771,090 B2 | 8/2004 | Harris et al. |
| 6,771,806 B1 | 8/2004 | Satya et al. |
| 6,774,651 B1 | 8/2004 | Hembree |
| 6,777,964 B2 | 8/2004 | Navratil et al. |
| 6,778,140 B1 | 8/2004 | Yeh |
| 6,784,679 B2 | 8/2004 | Sweet et al. |
| 6,788,093 B2 | 9/2004 | Aitren et al. |
| 6,791,344 B2 | 9/2004 | Cook et al. |
| 6,794,888 B2 | 9/2004 | Kawaguchi et al. |
| 6,794,950 B2 | 9/2004 | Du Toit et al. |
| 6,798,226 B2 | 9/2004 | Altmann et al. |
| 6,801,047 B2 | 10/2004 | Harwood et al. |
| 6,806,724 B2 | 10/2004 | Hayden et al. |
| 6,806,836 B2 | 10/2004 | Ogawa et al. |
| 6,809,533 B1 | 10/2004 | Anlage et al. |
| 6,812,718 B1 | 11/2004 | Chong et al. |
| 6,822,463 B1 | 11/2004 | Jacobs |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,864,694 B2 | 3/2005 | McTigue |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,914,244 B2 | 7/2005 | Alani |
| 6,914,580 B2 | 7/2005 | Leisten |
| 6,924,656 B2 | 8/2005 | Matsumoto |
| 6,927,079 B1 | 8/2005 | Fyfield |
| 6,937,341 B1 | 8/2005 | Woollam et al. |
| 6,965,226 B2 | 11/2005 | Dunklee |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |

| | | |
|---|---|---|
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,138,813 B2 * | 11/2006 | Cowan et al. ............... 324/760 |
| 7,187,188 B2 | 3/2007 | Andrews et al. |
| 7,188,037 B2 | 3/2007 | Hidehira |
| 7,221,172 B2 | 5/2007 | Dunklee |
| 7,250,779 B2 | 7/2007 | Dunklee et al. |
| 7,362,115 B2 | 4/2008 | Andrews et al. |
| 7,501,810 B2 | 3/2009 | Dunklee |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gundersen et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Jonsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |

| | | |
|---|---|---|
| 2007/0030021 A1 | 2/2007 | Cowan et al. |

FOREIGN PATENT DOCUMENTS

| | | |
|---|---|---|
| DE | 29 12 826 | 10/1980 |
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 195 22 774 | 1/1997 |
| DE | 196 18 717 | 1/1998 |
| DE | 288 234 | 3/1999 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-011243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7-84003 | 3/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multipart SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70(11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18$^{th}$ Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sept. 20, 1982.

Signatone S-1240 Thermal Controller, 2 page description.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between −196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68$^{th}$ Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

Cascade Microtech, Inc. vs. Micromanipulator Company, Inc., "Deposition of Harry F. Applebay," United States District Court for the District of Oregon, Lead Case No. 97-479-Al.

Flexion Corporation, "Cryotest Station MP-3," Cascade Microtech, Inc. vs. Micromanipulator Company, Inc., Applebay Exhibit 576, May 13, 1998, 68 pages.

Flexion Corporation, "Cryotest Station MP-3," Cascade Microtech, Inc. vs. Micromanipulator Company, Inc., Applebay Exhibit 578, May 13, 1998, 1 page.

Cascade Microtech, Inc. vs. Micromanipulator Company, Inc., Applebay Exhibit 572, May 13, 1998, 2 pages.

Cascade Microtech, Inc. vs. Micromanipulator Company, Inc., Applebay Exhibits 581A, 581B, and 581C, May 13, 1998, 3 pages.

Flexion Corporation, "AP-1 Cryotest Station User Manual," Applebay Exhibit 583, May 13, 1998, 187 pages.

Cascade Microtech, Inc. vs. Micromanipulator Company, Inc., Applebay Exhibits 577A, 577B, 577C, May 13, 1998, 3 pages.

Cascade Microtech, Inc. vs. Micromanipulator Company, Inc., Applebay Exhibit 585, May 13, 1998, 7 pages.

* cited by examiner

PROBE STATION THERMAL CHUCK WITH SHIELDING FOR CAPACITIVE CURRENT

CROSS REFERENCE TO RELATED APPLICATIONS

This is a continuation of application Ser. No. 11/546,827, filed Oct. 11, 2006, now U.S. Pat. No. 7,292,057; which is a continuation of application Ser. No. 10/626,903, filed Jul. 25, 2003, now U.S. Pat. No. 7,138,813, issued Nov. 21, 2006; which is a continuation of application Ser. No. 10/308,847, filed Dec. 2, 2002, now U.S. Pat. No. 6,642,732 B2, issued Nov. 4, 2003; which is a continuation of application Ser. No. 10/179,771, filed Jun. 24, 2002, now U.S. Pat. No. 6,512,391 B2, issued Jan. 28, 2003; which is a continuation of application Ser. No. 09/345,571, filed Jun. 30, 1999, now U.S. Pat. No. 6,445,202, issued Sep. 3, 2002.

BACKGROUND OF THE INVENTION

The present invention is directed to probe stations suitable for making low current and low voltage measurements and, more particularly, to a system for reducing noise due to capacitive currents resulting from the operation of a thermal chuck for a probe station.

Integrated circuit devices are typically manufactured in and on a wafer of semiconductor material using well-known techniques. Prior to cutting the individual integrated circuit devices from a wafer, tests are run on individual devices to determine if the devices operate properly. The wafer is supported on a chuck inside an environmental enclosure in a probe station. Probes are brought into contact with test points or pads on the integrated circuit devices and a series of measurements are performed. Schwindt et al., U.S. Pat. No. 5,663,653, disclose an example of a probe station in which the present invention might be used and the patent is incorporated herein by reference.

Many integrated circuit devices are designed to operate at temperatures other than room temperature. To accommodate device testing at temperatures other than the ambient temperature, a thermal chuck may be employed. One design of a thermal chuck comprises a multilayered chuck for securing a wafer having a thermal driver to modify the temperature of the chuck. A thermal chuck of this design is disclosed by Schwindt in U.S. Pat. No. 5,610,529 which is incorporated herein by reference.

The thermal driver may provide for either heating, cooling, or heating and cooling of the chuck. To modify the temperature of the chuck, the thermal driver may comprise one or more thermal units including a thermal device and a plurality of power conductors connecting the thermal device to a power source. Thermal devices, typically electric resistance heaters or thermoelectric heat pumps, are provided to heat the chuck to temperatures above the ambient temperature. The thermoelectric heat pump, also known as a Peltier device, is reversible and can be used for cooling as well as heating the chuck. The thermoelectric heat pump comprises a number of thermocouples sandwiched between two electrically insulating, thermally conductive plates. When DC power is supplied to the thermocouples, the Peltier effect causes heat to be transferred from one plate to the other. The direction of heat flow is reversible by reversing the direction of current flow in the thermocouples. Exposing the chuck to the warmer plate or the cooler plate of the thermoelectric heat pump will, respectively, either heat or cool the chuck. For testing at temperatures below ambient, the thermal chuck may also include passages for circulating coolant to cool the chuck directly or remove excess heat from the thermoelectric heat pump.

When making the low voltage and low current measurements common to testing integrated circuit devices, even very low levels of electrical noise are unsatisfactory. Thermal chucks include several sources of noise and unacceptably high levels of noise are a common problem when using a thermal chuck. One known source of noise is the result of expansion or contraction of the components of the thermal chuck due to changing temperature. Expansion or contraction changes the spacing between conductive components resulting in the generation of capacitive currents which can reach the conductive surface of the chuck. Expansion or contraction due to temperature change can also cause relative transverse movement between the multiple material layers of the chuck. Relative movement between contacting layers of insulating and conductive materials can generate triboelectric current. In a probe station chuck, the triboelectric current can appear as noise in the test measurements. Triboelectric currents can be reduced by a chuck design which prevents movement between contacting layers of insulating and conducting materials.

The operation of the thermal units by the thermal driver controller is another potential source of noise when using a thermal chuck. To change or maintain the temperature of the thermal chuck, the thermal driver controller fluctuates the electrical power to the thermal units in response to a temperature control system. As a result of the voltage drop within the conductors of the thermal units, physically adjacent portions of the electrical conductors leading to and from, and internal to the thermal devices, will be at different potentials. As the power fluctuates, the difference in voltage between the power conductors changes with time. This results in a displacement of charges in the dielectric material surrounding the conductors which manifests itself as a displacement or capacitive current coupled to the conductive top surface of the chuck. This capacitive current appears as noise in the test measurements.

The currently accepted technique to reduce the effects of capacitive currents involves shielding the chuck from external electromagnetic sources. However, the shielding layers of conductive material in the chuck have proven unsuccessful in eliminating the noise from the thermal driver. To reduce noise due to capacitive currents originating in the thermal chuck, users of probe stations often shut off the thermal units and wait for the current to dissipate. However, the RC time constant involved can be greater than five seconds. Waiting a period of five time constants (e.g. 25 seconds) for the observed noise to dissipate to an acceptable level before making a measurement substantially effects the productivity of the probe station. What is desired, therefore, is a system for reducing the electrical noise generated by the operation of the thermal unit of a probe station's thermal chuck. Reducing noise generated by the thermal chuck reduces the time for the noise to dissipate to acceptable levels improving the productivity of the probe station.

DETAILED DESCRIPTION OF THE PREFERRED EMBODIMENT

Figure 1:
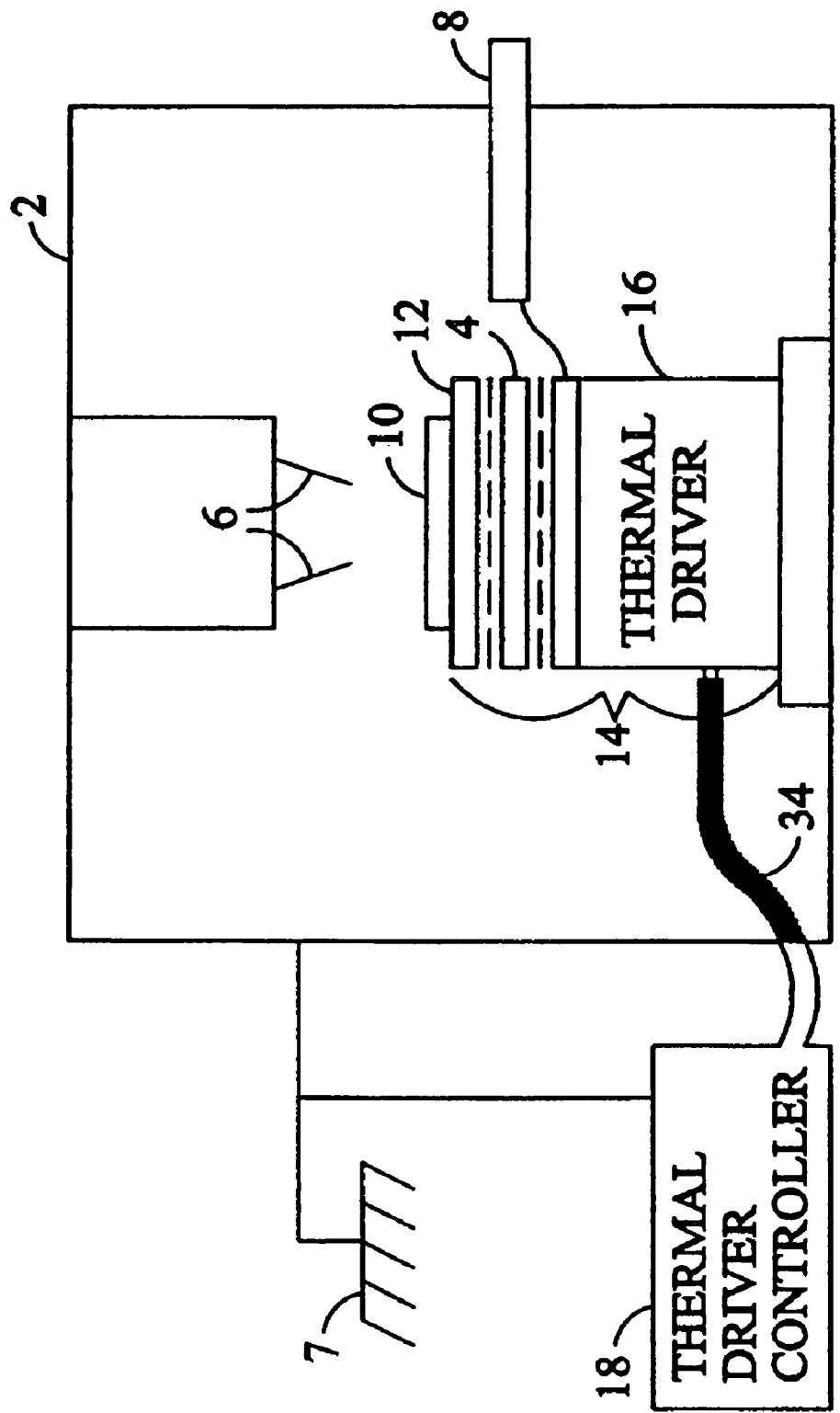
FIG. 1 is a cross-section of a probe station incorporating a thermal chuck.

As illustrated in FIG. 1, a probe station generally includes an environmental enclosure 2 in which is located a chuck 4 and one or more probes 6. The environmental enclosure 2 is typically constructed of a conductive material and grounded 7 so that the chamber, interior to the enclosure 2, is shielded from electromagnetic fields emanating from outside of the enclosure 2. The chuck 4 typically comprises multiple layers of conductive and dielectric materials that are connected to the various conductors of a coaxial or triaxial cable 8. The chuck 4 includes a securement technique for securing a device under test 10, generally a wafer of semiconductor material, to the upper surface 12 of the chuck 4. The upper surface 12 of the chuck 4 is typically conductive. One technique for securing a device under test 10 relies on a vacuum source (not shown) located outside of the environmental enclosure. The vacuum source communicates through appropriate control valves and piping with apertures (not shown) in the upper surface 12 of the chuck 4. When the device under test 10 is placed on the chuck 4 the device blocks apertures leading to the vacuum source. Air pressure holds the device under test 10 against the chuck's upper surface 12. One or more probes 6 can be positioned over the device under test 10 and brought into contact with test pads on the circuit to be tested. Instrumentation connected to the probes 6 measures selected operating parameters of the circuit at the test pads.

Figure 2:
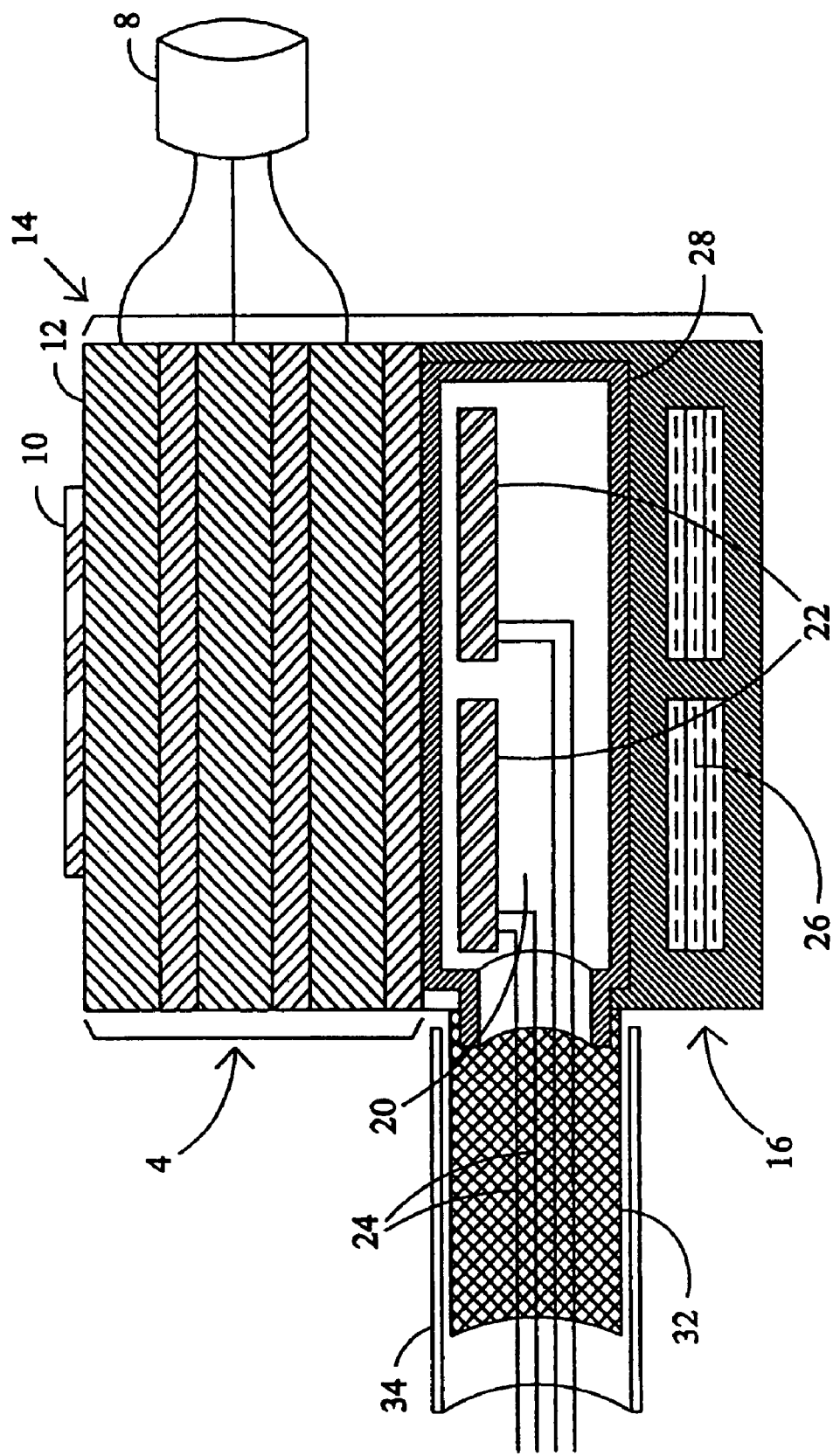
FIG. 2 is a cross section of an exemplary thermal chuck constructed in accordance with the present invention.

A thermal chuck 14, bracketed, may be used to test the operation of devices at temperatures other than the ambient temperature of the environmental enclosure 2. Referring to FIG. 2, the thermal chuck 14, indicated with a bracket, may include a thermal driver 16 having facilities for modifying the temperature of a chuck 4, indicated with a bracket, supported on the top of the thermal driver 16. The thermal driver 16 may be arranged to provide for either heating, cooling, or heating and cooling of the chuck 4. The thermal driver 16 comprises one or more electrically powered thermal units 20 each of which includes one or more thermal devices 22 and a plurality of insulated power conductors 24 connecting the thermal devices 22 to a thermal driver controller 18. Typically, the thermal devices 22 are resistance heaters or thermoelectric heat pumps. Resistance heaters and thermoelectric heat pumps can increase the temperature of the chuck 4. The thermoelectric heat pump can also be used to cool the chuck 4. The thermoelectric heat pump, also known as a Peltier device, comprises a plurality of electrically connected thermocouples of p-type and n-type semiconductor materials sandwiched between two plates of an electrically insulating, thermally conducting material. When DC power is supplied to the thermocouples, heat is transferred from one plate to the other as a result of the Peltier effect. The direction of heat flow is reversible by reversing the direction of current flow in the semiconductors. Exposing the chuck 4 to the warmer plate or the cooler plate of the thermoelectric heat pump will, respectively, heat or cool the chuck 4.

The thermal driver 16 may also include passages 26 for circulating coolant supplied by a coolant source (not shown) typically located outside of the environmental enclosure 2. For testing at temperatures below the ambient temperature, the chuck 4 may be cooled directly by the coolant. If a thermoelectric heat pump is used to cool the chuck, circulating coolant may be necessary to remove heat transferred to the thermal driver 16 by the heat pump.

Electric power for the thermal units 20 is supplied by the thermal driver controller 18 located outside of the environmental enclosure 2. Insulated power conductors 24 transfer the electrical power to the thermal devices 22 in the thermal chuck 14. In response to a temperature sensing system, the thermal driver controller 18 fluctuates the electrical power to the thermal unit 20 to vary its thermal output to either reduce or increase the rate of addition or removal of thermal energy to or from the chuck 4. As a result of the voltage drop in the thermal unit 20, adjacent portions of the insulated power conductors 24 and the conductors inside the thermal devices 22 are at differing potentials. This causes a displacement of charge in the dielectric material surrounding the conductors. As the thermal driver controller 18 fluctuates the power to the thermal unit 20 the difference in voltage between adjacent conductors also varies with time. The present inventors came to the realization that this displacement of charge varying with time causes a displacement or capacitive current which is coupled to the conductive upper surface 12 of the chuck 4. The present inventors further realized that this capacitive current manifests itself as noise in the test measurements.

Figure 3:
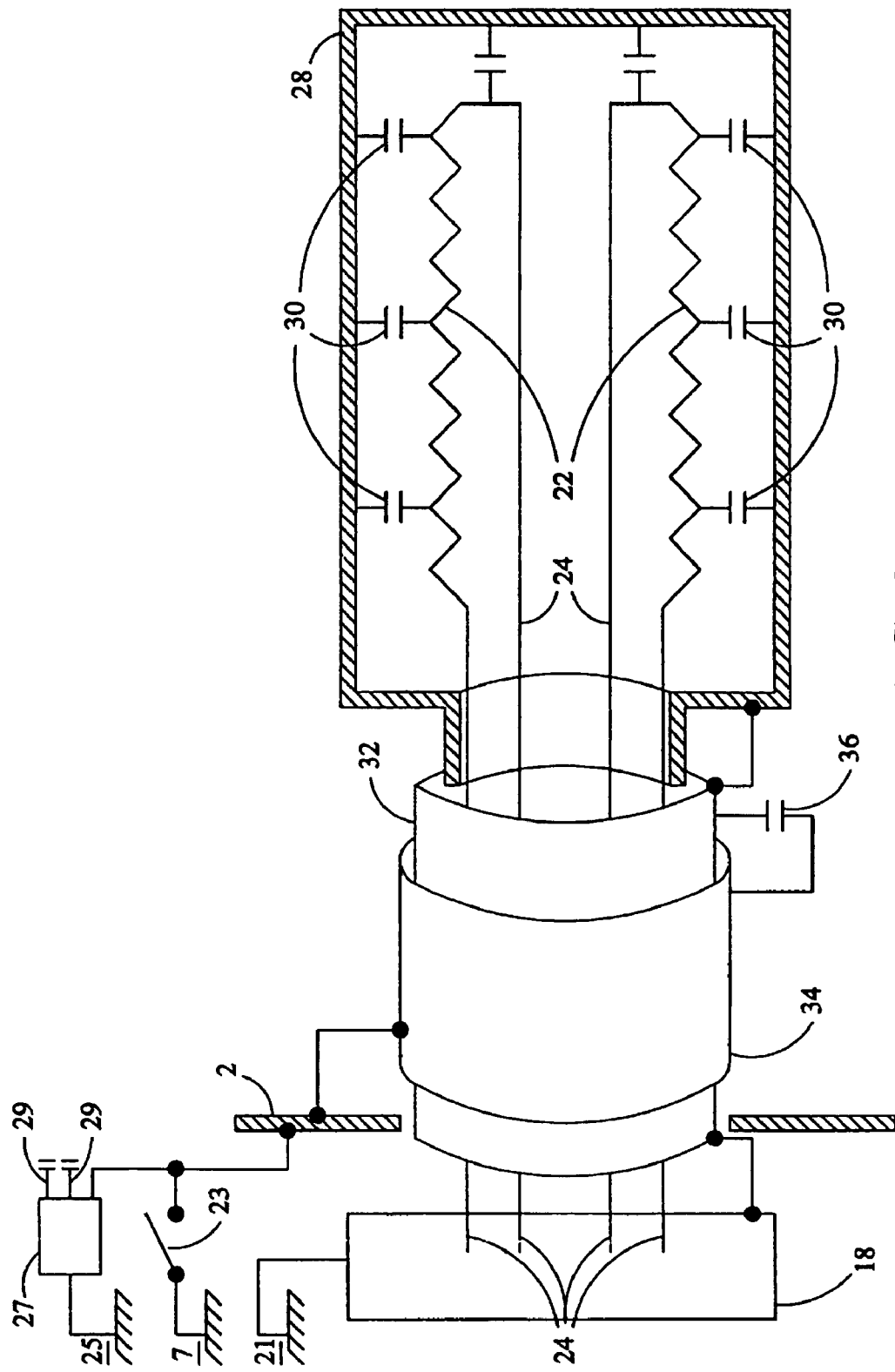
FIG. 3 is an exemplary schematic diagram of a thermal unit and shielding in accordance with a first aspect of a preferred embodiment of the present invention.

The present inventors came to the realization that the aforementioned capacitive currents are a significant source of noise when making measurements in the femtoamp range with state of the art probe stations. The present inventors further realized that conductive shielding of the thermal unit 20 that is capacitively coupled to the conductors of the thermal unit 20 can intercept a substantial amount, and preferably substantially all, of the capacitive currents resulting from the operation of the thermal unit 20 and provide a conductive path to return any current induced in the conductive shielding to the thermal driver controller 18 and to ground. This is in contrast to the presently accepted techniques of adding more shielding to the chuck itself. Referring also to FIG. 3, a conductive thermal device shell 28 substantially encloses the thermal devices 22 and the power conductors 24 at their connection to the thermal devices 22. Variation in charge displacement resulting from the operation of the electric circuit of the thermal device 22 results in a displacement current in the conductive thermal device shell 28. In other words, the thermal device shell 28 is capacitively coupled through "virtual" coupling capacitors 30 to the electric circuit of the thermal device 22 and intercepts capacitive currents that would otherwise find their way to the upper surface 12 of the chuck 4. Although apertures may be required in the thermal device shell 28 they should be minimized in relation to the total surface area of the thermal device shell 28. The more completely the thermal device shell 28 spatially encloses the thermal device 22 the more completely it will intercept capacitive currents emanating from the thermal device 22. The thermal device shell 28 is conductively connected to the thermal driver controller 18 through the conductive shield of the cable 32. The conductive connection of the thermal device shell 28 to the thermal driver controller 18 provides a path for any current in the thermal device shell 28 to exit the environmental enclosure 2 to the thermal driver controller 18. The driver controller 18 is connected to ground 7 extending the conductive return path for capacitive currents to ground 7.

The present inventors also came to the stark realization that by enclosing the thermal devices 22 with a conductive shell 28 the RC time constant of the thermal chuck is dramatically reduced. The thermal devices 22 do not need to be turned off in order for the noise to be sufficiently reduced. The present inventors determined that this reduction in RC time constant is due to a reduction in the stored capacitive charge in the dielectric material within the chuck, referred to as absorption capacitance. The absorption capacitance of a material includes a series resistance so, in effect, it has a memory of previous charges and is slow to dissipate. This absorption capacitance was not previously considered in the design of thermal chucks. There was little, if any, motivation to enclose the thermal devices 22 in a conductive enclosure, as it was believed that noise from the thermal devices 22 could be removed by layers of shielding in the chuck 4. The layers of the chuck 4 include, however, dielectric material which the inventor realized is, in fact, a source of the long RC time constant.

The cable 32 includes the power conductors 24 connecting the thermal driver controller 18 to the thermal devices 22. The shield of the cable 32 ideally extends through the wall of the environmental enclosure 2 and encompasses the power conductors 24 at their entrance into the thermal device shell 28. The shield of the cable 32 is capacitively coupled to the power conductors 24 and will intercept and return to the thermal driver controller 18 currents emanating from the capacitive effects of power fluctuation in the power conductors 24. The thermal driver controller 18 is grounded at ground connection 21. The more complete the enclosure of all conductors in the thermal unit 20 by the conductive shielding, the more complete will be the protection of the test measurement from noise generated by the operation of the thermal unit 20.

The walls of the environmental enclosure 2 are typically conductive material. The conductive material shields the chamber inside the environmental enclosure 2 from electromagnetic (EM) fields originating outside of the enclosure 2 which would otherwise result in noise within the probe 6. The environmental enclosure 2 is grounded to return to ground the currents generated in the conductive wall by the EM fields. In a preferred embodiment of the present invention, the conductive wall of the environmental enclosure is extended to substantially surround parts of the thermal units. The extension of the wall of the enclosure provides a conductive shield capacitively coupled to the thermal units which can return capacitive currents to the enclosure ground.

Referring to FIG. 3, in a first aspect of this preferred embodiment the wall of the environmental enclosure 2 is extended coaxially with yet another shield layer 34 of the cable 32 to a point of close physical proximity to the thermal device shell 28 yet being free from direct electrical connection to the shield of the cable 32, the thermal driver controller 18, and the thermal device shell 28. The wall of the environmental enclosure 2 is extended proximate to the thermal device shell 28 by connecting the outer shield layer 34 of the cable 32 to the wall of the environmental enclosure 2. The cable 32 includes the power conductors 24 connecting the thermal driver controller 18 to the thermal devices 22. Capacitive currents emanating from the power conductors 24 are intercepted by the shield of cable 32 and returned to the thermal driver controller 18 and the thermal driver controller ground 21. The extension of the wall of the environmental enclosure 2 through the outer shield 34 of the power cable 32 is capacitively coupled to the shield of the cable 32 by a "virtual" capacitor 36 and intercepts capacitive currents leaking from within the cable 32 which might otherwise couple to the chuck 4. Any current in the extension of the environmental enclosure 2 is returned to ground 7 outside of the environmental enclosure 2 if switch 23 is closed. If the switch 23 is open, capacitive currents are returned to the ground 25 of an instrument 27 which is connected by leads 29 to probes inside the chamber.

Figure 4:
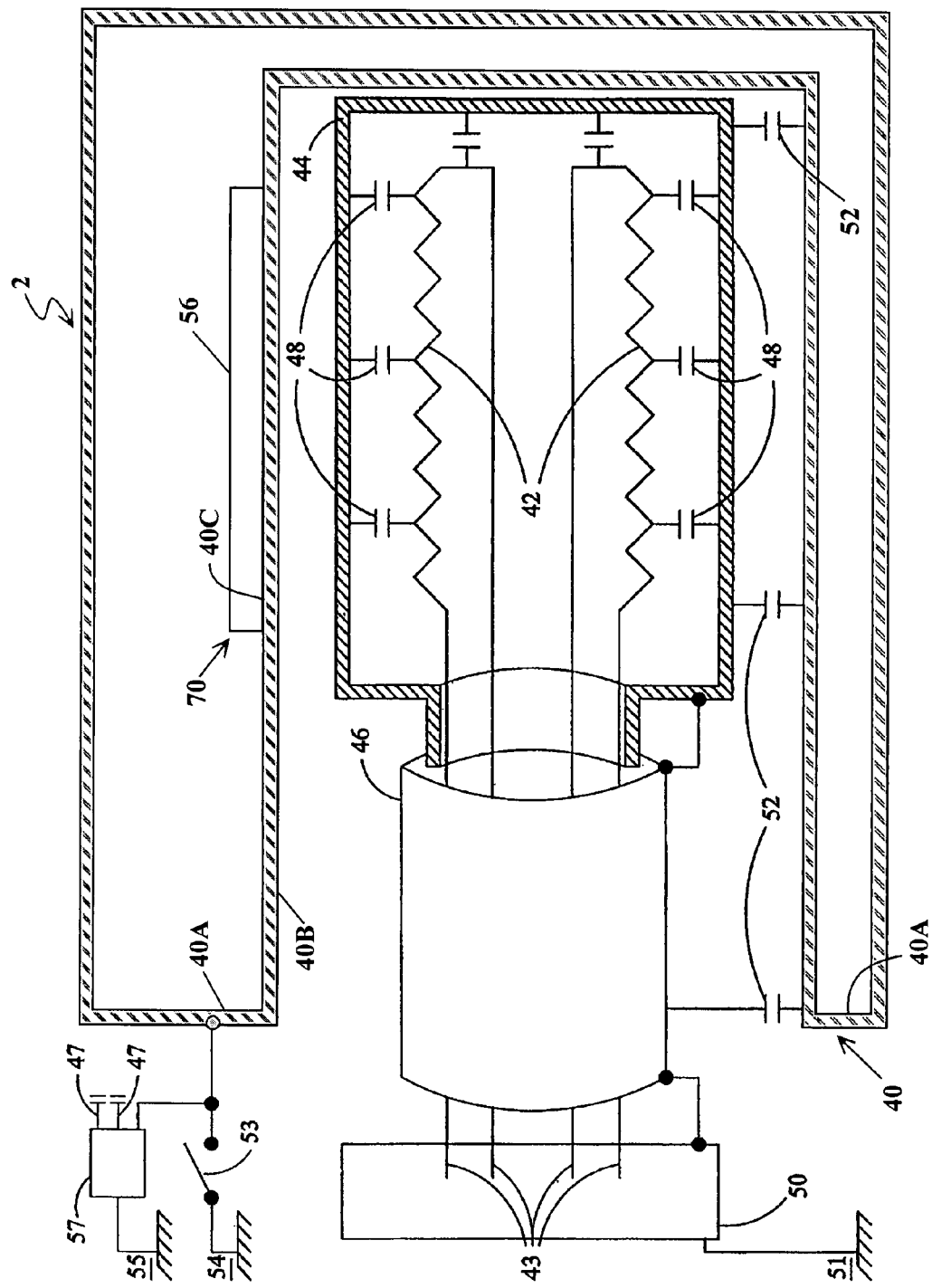
FIG. 4 is an exemplary schematic diagram of a thermal unit and shielding in accordance with a second aspect of a preferred embodiment of the present invention.

Referring to FIG. 4, in a second aspect of this preferred embodiment the wall 40 of the environmental enclosure 2 is extended to substantially surround the thermal devices 42, the thermal device shell 44 and the power cable 46, comprising electrical conductors 43, connecting the thermal devices 42 to the thermal driver controller 50. Heat is transferred to and from the device supporting surface 56 of the chuck 70 through the thermal device shell 44 and the wall of the environmental enclosure 40, which includes an outer surface 40B and inner surface 40A enclosing the chuck and having a portion 40C that separates the device supporting surface of the chuck from the thermal devices 42. The thermal devices 42 are capacitively coupled to the thermal shell 44 by virtual capacitors 48. The thermal device shell 44 and the shield of the power cable 46 are, in turn, capacitively coupled to the wall of the environmental enclosure 40 by virtual coupling capacitors 52. Capacitive currents in the thermal device shell 44 or the shield of the cable 46 are returned to the thermal driver controller 50 through the conductive shield layer of the cable 46. The thermal driver controller 50 is connected to the thermal devices 42 by power conductors 43 and to ground at ground 51. Capacitive currents leaking from the thermal device shell 44 or the power cable 46 will be intercepted by the wall of the enclosure and returned to the enclosure ground 54 when the switch 53 is closed. When the switch 53 is open, capacitive currents in the wall 40 of the environmental enclosure are returned to the ground 55 of the instrument 57. The instrument 57 is connected to the probes 6 inside the environmental enclosure by instrument leads 47.

Figure 5:
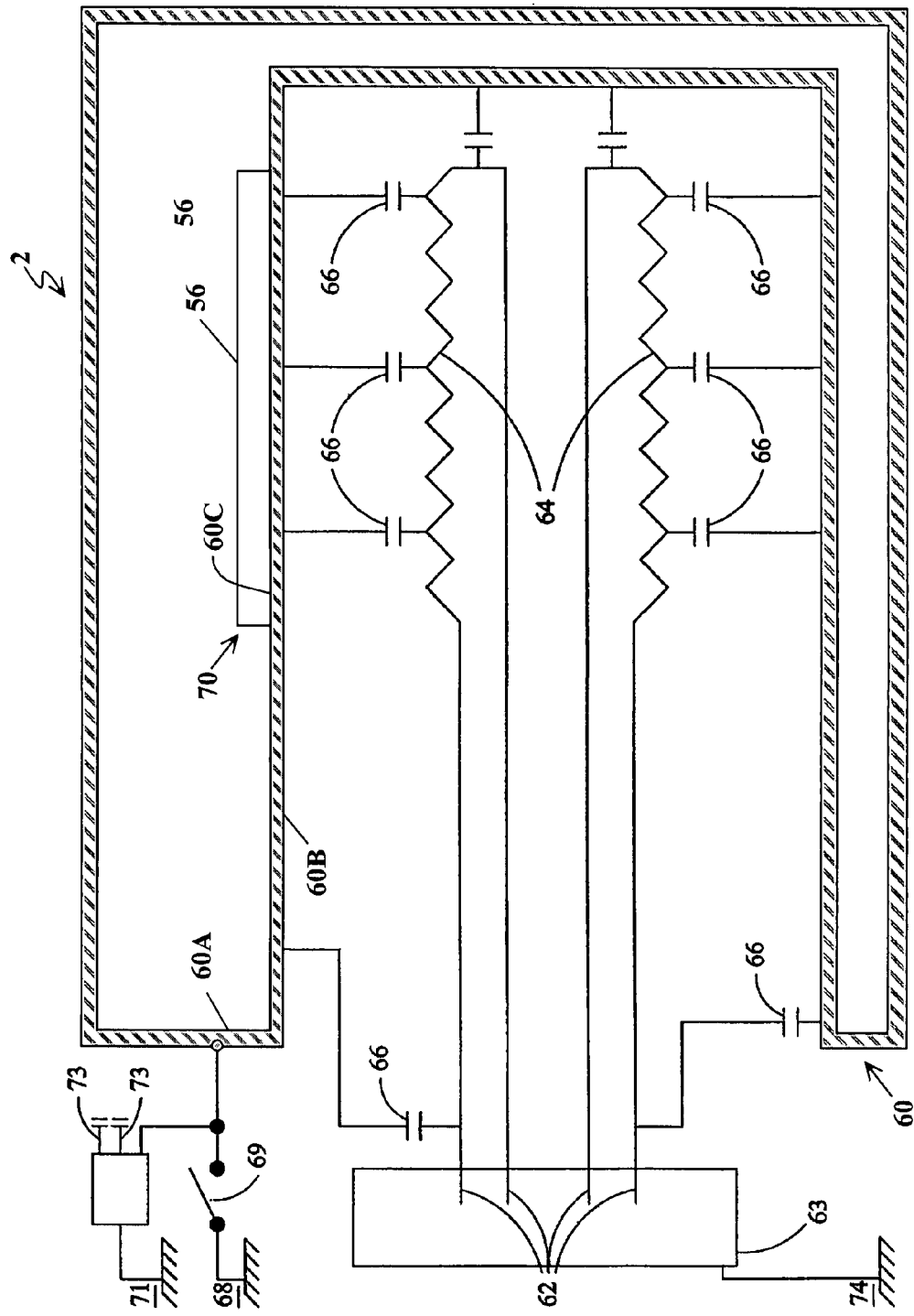
FIG. 5 is an exemplary schematic diagram of a thermal unit and shielding in accordance with a third aspect of a preferred embodiment of the present invention.

Referring to FIG. 5, in a third aspect of this preferred embodiment the wall 60 of the environmental enclosure 2, comprising an inner surface 60A defining the interior of the enclosure and an outer surface 60B, is extended to substantially surround the thermal devices 64 and the power conductors 62 connecting the thermal devices 64 to the thermal driver controller 63. The outer surface 60B of the wall 60 substantially encircles the thermal devices 64 so that portion of the wall including a portion 60C of the inner surface 60A separates the thermal devices from the device supporting surface 56 of the chuck 70. The thermal driver controller is grounded at ground 74. In this aspect of the invention, the thermal devices 64 and the power conductors 62 are capacitively coupled to the wall 60 of the environmental enclosure through the virtual coupling capacitors 66. Capacitive currents generated in the thermal devices 64 or power cables 62 are intercepted by the shield formed by the conductive wall of the enclosure 60 and returned to the enclosure ground 68 when the switch 69 is closed. If the switch 69 is open the walls of the enclosure are grounded through the instrument 73 to the instrument ground 71. Heat is transferred to and from the chuck 70 through the wall 60 of the environmental enclosure.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A thermal chuck including a surface for supporting a device under test, said thermal chuck comprising:
   (a) an electrically powered thermal unit for modifying a temperature of said surface; and
   (b) a first conductive member substantially enclosing said thermal unit and including a portion separating said thermal unit from said surface.

2. The thermal chuck of claim 1 further comprising a conductive connection of said first conductive member to a ground potential.

3. The thermal chuck of claim 1 further comprising conductive connection of a ground potential to said first conductive member and to a controller supplying power to said thermal unit.

4. The thermal chuck of claim 1 further comprising a second conductive member substantially encircling a power cable conducting electric power to said thermal unit, said second conductive member conductively connected to a ground potential.

5. The thermal chuck of claim 1 further comprising:
  (a) a controller supplying electric power to said thermal unit; and
  (b) a second conductive member substantially encircling a portion of a power cable conducting electric power from said controller to said thermal unit, said controller, said first conductor and said second conductor conductively connected to a ground potential.

6. The thermal chuck of claim 5 further comprising a third conductive member substantially encircling a portion of said second conductive member and conductively connected to another ground potential.

7. The thermal chuck of claim 6 wherein said another ground potential comprises a ground potential connected to an enclosure comprising portions defining a chamber in which said thermal chuck is located.

8. The thermal chuck of claim 6 wherein said another ground potential comprises a ground potential for an instrument for measuring a characteristic of said device under test supported on said surface.

9. A method of reducing a time for making a probing measurement of a device under test supported on a surface of a chuck, said chuck comprising a dielectric and a thermal unit for modifying a temperature of said surface, said method comprising:
  (a) substantially enclosing said thermal unit with a conductive member, said conductive member including a surface interposed between said thermal unit and said surface of said chuck; and
  (b) conductively connecting said conductive member to a controller supplying electric power to said thermal unit.

10. The method of reducing a time for making a probing measurement of claim 9 further comprising the step of grounding said conductive member and said controller at a common ground potential.

11. The method of reducing a time for making a probing measurement of claim 9 further comprising the step of substantially encircling a power conductor conductively connecting said thermal unit and said controller with a second conductive member conductively connected to said controller.

12. The method of reducing a time for making a probing measurement of claim 11 further comprising the step of grounding said controller, said first conductive member and said second conductive member at a common ground potential.

13. The method of reducing a time for making a probing measurement of claim 11 further comprising the step of substantially encircling said second conductive member with a third conductive member conductively connected to an enclosure comprising a portion defining a chamber in which said chuck is located.

14. The method of reducing a time for making a probing measurement of claim 13 further comprising the step of connecting a probe measurement instrument and said enclosure to a common ground potential.

15. A probe station comprising:
  (a) a thermal chuck including a surface for supporting a device under test and an electrically powered thermal unit for modifying a temperature of said surface; and
  (b) a conductive member substantially enclosing at least one of said surface and said thermal unit and including a portion separating said surface and said thermal unit.

16. The probe station of claim 15 further comprising a conductive connection between said conductive member and a ground potential.

17. The probe station of claim 16 wherein a controller supply electric power is also connected to said ground potential.

18. The probe station of claim 16 wherein an instrument for measuring a characteristic of said device under test is also connected to said ground potential.

19. The probe station of claim 15 wherein said conductive member substantially encircles a portion of an electric power conductor connected to said thermal unit.

* * * * *